(12) United States Patent
Sir et al.

(10) Patent No.: US 11,322,434 B2
(45) Date of Patent: May 3, 2022

(54) TOP-TO-BOTTOM INTERCONNECTS WITH MOLDED LEAD-FRAME MODULE FOR INTEGRATED-CIRCUIT PACKAGES

(71) Applicant: Intel Corporation, Santa Clara, CA (US)

(72) Inventors: Jiun Hann Sir, Gelugor (MY); Poh Boon Khoo, Perai (MY); Eng Huat Goh, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/912,595

(22) Filed: Jun. 25, 2020

(65) Prior Publication Data
US 2021/0057318 A1 Feb. 25, 2021

(30) Foreign Application Priority Data
Aug. 22, 2019 (MY) .......................... PI2019004847

(51) Int. Cl.
| *H01R 9/00* | (2006.01) |
| *H01L 23/498* | (2006.01) |
| *H05K 3/34* | (2006.01) |
| *H01L 21/48* | (2006.01) |

(52) U.S. Cl.
CPC .... *H01L 23/49816* (2013.01); *H01L 21/4853* (2013.01); *H01L 23/49861* (2013.01); *H05K 3/3426* (2013.01)

(58) Field of Classification Search
CPC ......... H01L 23/49816; H01L 23/49861; H01L 21/4853; H05K 3/3426
USPC .......................................................... 36/773
See application file for complete search history.

(56) References Cited

U.S. PATENT DOCUMENTS

| 10,978,407 B2* | 4/2021 | Kong .................. H01L 23/5387 |
| 2005/0104164 A1* | 5/2005 | Awujoola ................ H01L 23/10 257/659 |

* cited by examiner

*Primary Examiner* — Andargie M Aychillhum
(74) *Attorney, Agent, or Firm* — Schwegman Lundberg & Woessner, P.A.

(57) ABSTRACT

Disclosed embodiments include folded, top-to-bottom interconnects that couple a die side of an integrated-circuit package substrate, to a board as a complement to a ball-grid array for a flip-chip-mounted integrated-circuit die on the die side. The folded, top-to-bottom interconnect is in a molded frame that forms a perimeter around an infield to receive at least one flip-chip IC die. Power, ground and I/O interconnections shunt around the package substrate, and such shunting includes voltage regulation that need not be routed through the package substrate.

23 Claims, 6 Drawing Sheets

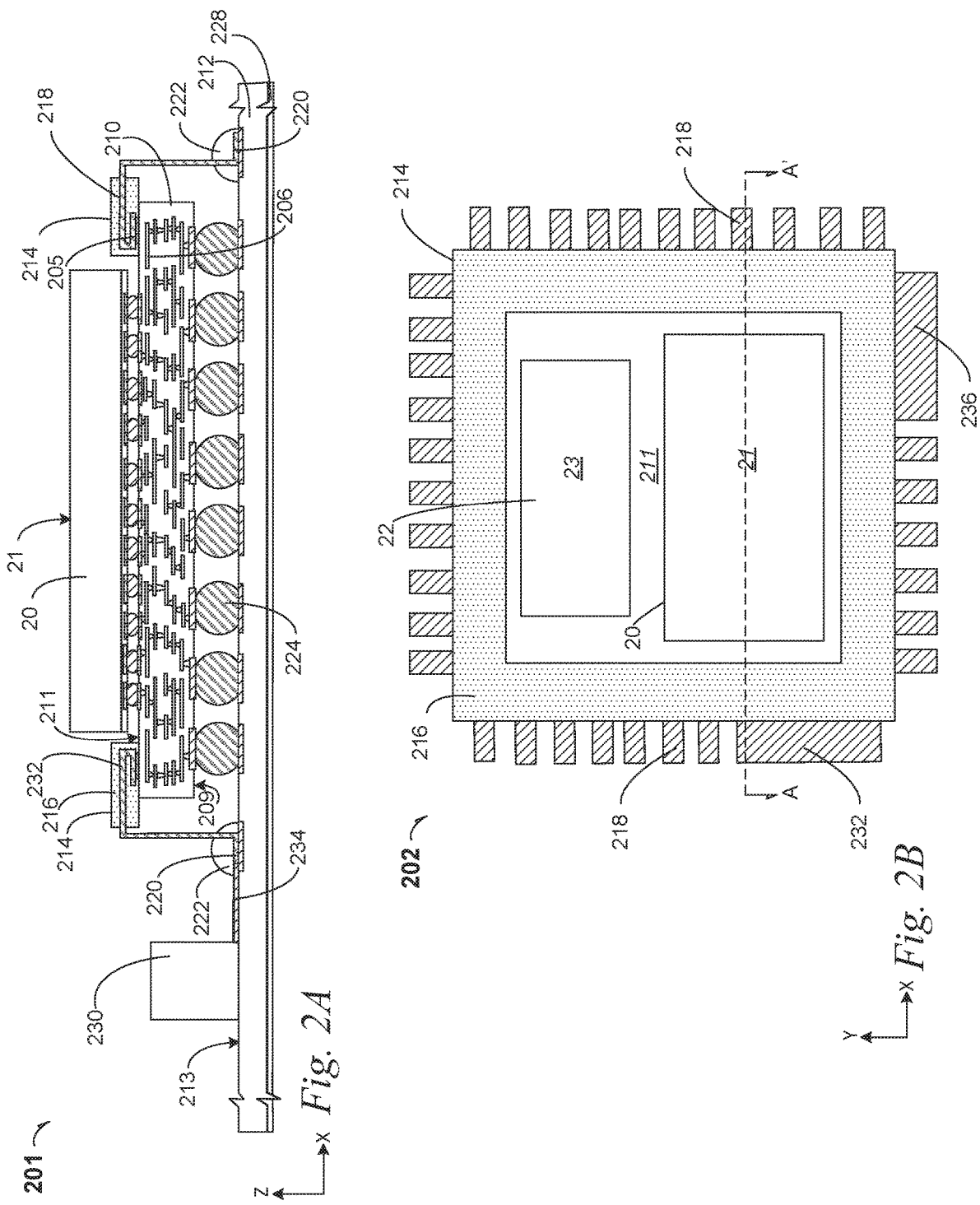

TOP-TO-BOTTOM INTERCONNECTS WITH MOLDED LEAD-FRAME MODULE FOR INTEGRATED-CIRCUIT PACKAGES

PRIORITY APPLICATION

This application claims the benefit of priority to Malaysian Application Serial Number P12019004847, filed Aug. 22, 2019, which is incorporated herein by reference in its entirety.

FIELD

This disclosure relates to interconnect-density for integrated-circuit packages.

BACKGROUND

Integrated-circuit chip packages use die-side interconnects that couple to the land side, for flip-chip configurations. Valuable die-side real estate must be used for the interconnects.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 2A is a cross-section elevation of a top-to-bottom interconnect lead frame in an integrated-circuit package according to an embodiment;

FIG. 2B is a top plan of the top-to-bottom interconnect depicted in FIG. 2A according to several embodiments;

DETAILED DESCRIPTION

Flip-chip packaging of integrated-circuit devices with input-output (I/O) electrical bumps, have complementary top-to-bottom (T2B) interconnects to increase I/O density. The T2B interconnects are configured in a molded lead frame, and each interconnect communicates from a die side of an integrated-circuit package substrate to a board upon which the IC package substrate is mounted. The T2B interconnects, shunt around the integrated-circuit package substrate to the board.

The I/O electrical bumps that are on the die side, are also coupled to the board through the integrated-circuit package substrate, from an integrated-circuit die on the die side. The integrated-circuit package substrate is coupled at a land side, to the board by electrical bumps that contact both the boar and the land side.

Power delivery and voltage regulation can be shunted to the integrated-circuit device on the die side, by use of the T2B interconnects, such as from a platform voltage-regulator device on the board. Package size can be reduced by use of the T2B interconnects.

Compound T2B interconnects have more than one interconnect that trace a similar X-Z dimension from the die side to the board. Compound T2B interconnects in this configuration as lower outer and upper inner interconnects that are nested where they contact the die side of the IC package substrate. Signal integrity can be addressed by pairing an I/O T2B interconnect above a ground (Vss) interconnect, such that the I/O T2B interconnect has a relatively low electronic noise.

Figure 1A:
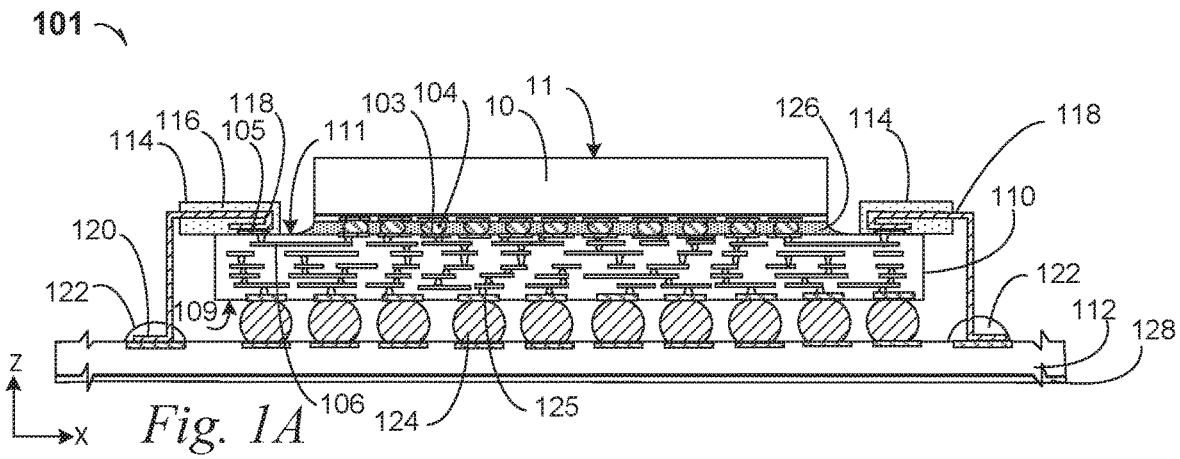
FIG. 1A is a cross-section elevation of a top-to-bottom interconnect lead frame in an integrated-circuit package according to an embodiment.

FIG. 1A is a cross-section elevation of a top-to-bottom (T2B) interconnect lead frame module 114 in an integrated-circuit package 101 according to an embodiment. An integrated-circuit die 10 is flip-chip mounted on an integrated-circuit package substrate 110 on a die side 111 according to an embodiment. The IC die 10 is coupled to an interconnect array, one bond pad of which is indicated by reference number 103. The interconnect array 103 may also be referred to as a bump-pad array 103. In an embodiment, the interconnect array 103 and the IC die 10 are contacted by an electrical bump array, one instance of which is indicated by reference number 104.

At a land side 109, the integrated-circuit package substrate 110 is coupled to a board 112 by an array of electrical bumps, one of which is enumerated 124. The land side 109 accommodates an electrical pad array 125 for the array of electrical bumps 124.

In an embodiment, a lead-frame, top-to-bottom (T2B) interconnect module 114 (or simply a T2B interconnect 114) includes a molded frame 116 and a folded interconnect 118 that is coupled to the die side 111 on the integrated-circuit package substrate 110, and to the board 112 by a terminal end 120.

As illustrated, the frame material 116 exposes a die-side level portion of the folded portion 118, where the folded portion of the interconnect 118 contacts the interconnect-pad array 105. In an embodiment, the folded interconnect 118 terminal end 120 is below the die side 111 in an embodiment. In an embodiment, the folded interconnect 118 terminal end 120 is below the land side 109.

The T2B interconnect 114 is coupled to the die side 111 by a peripheral interconnect array, one occurrence of which is indicated by reference number 105. In an embodiment, the peripheral interconnect array 105 surrounds the bump-pad array 103, such that a flip-chip integrated circuit die 10 is centrally coupled to the die side 111, and the T2B interconnect 114 is peripherally coupled to the die side 111.

In an embodiment, a given IC die 10 uses all connections of the peripheral interconnect array 105. In an illustrative embodiment, the peripheral interconnect pad 105 depicted at the left of the die side 111 is coupled to the IC die 10 through the IC package substrate 110 by a fan-out trace 106 that is near the die side 111. In an embodiment although the fan-out trace 106 couples the IC die 10 to the peripheral interconnect pad 105, the folded interconnect 118 is a "dummy" or placeholder folded interconnect 118 in a superset pin-count configuration of the IC package substrate 110 and the T2B interconnect 114, where an inactive interconnection is being used without a completed circuit.

In an embodiment, a superset pin count allows for modular use of the T2B interconnect 114, such as different IC dice with different pin-count configurations. In an embodiment, a superset pin count allows for modular use, such as for two IC dice with different pin-out requirements, to be side-by-side seated on the die side 111 (see, e.g. FIG. 4B), such that different IC dice may be modulated in a given IC-package build.

In an embodiment, a superset pin count on the die side 111 includes the peripheral interconnect array 103, and a given IC die 10 does not use all connections of the peripheral interconnect array 103. In an illustrative embodiment depicted in FIG. 2A, a peripheral interconnect pad 205 depicted at the right of a die side 211 of an IC package substrate 210 is not coupled to an IC die 20 through the IC package substrate 210 by a trace 206 that is near the die side 211.

In an embodiment, the terminal end 120 is a lead-frame interconnect foot 120. In an embodiment, the foot 120, if present, is electrically coupled to a bond pad on the board 112, by an electrical bump such as solder bump 122. Signal, power and ground coupling between the board 112 and the integrated-circuit die 10, can be both through the T2B interconnect 114, and through the electrical bumps 124 that contact the board 112 on a land side 109 of the integrated-circuit package substrate 110.

Figure 1B:
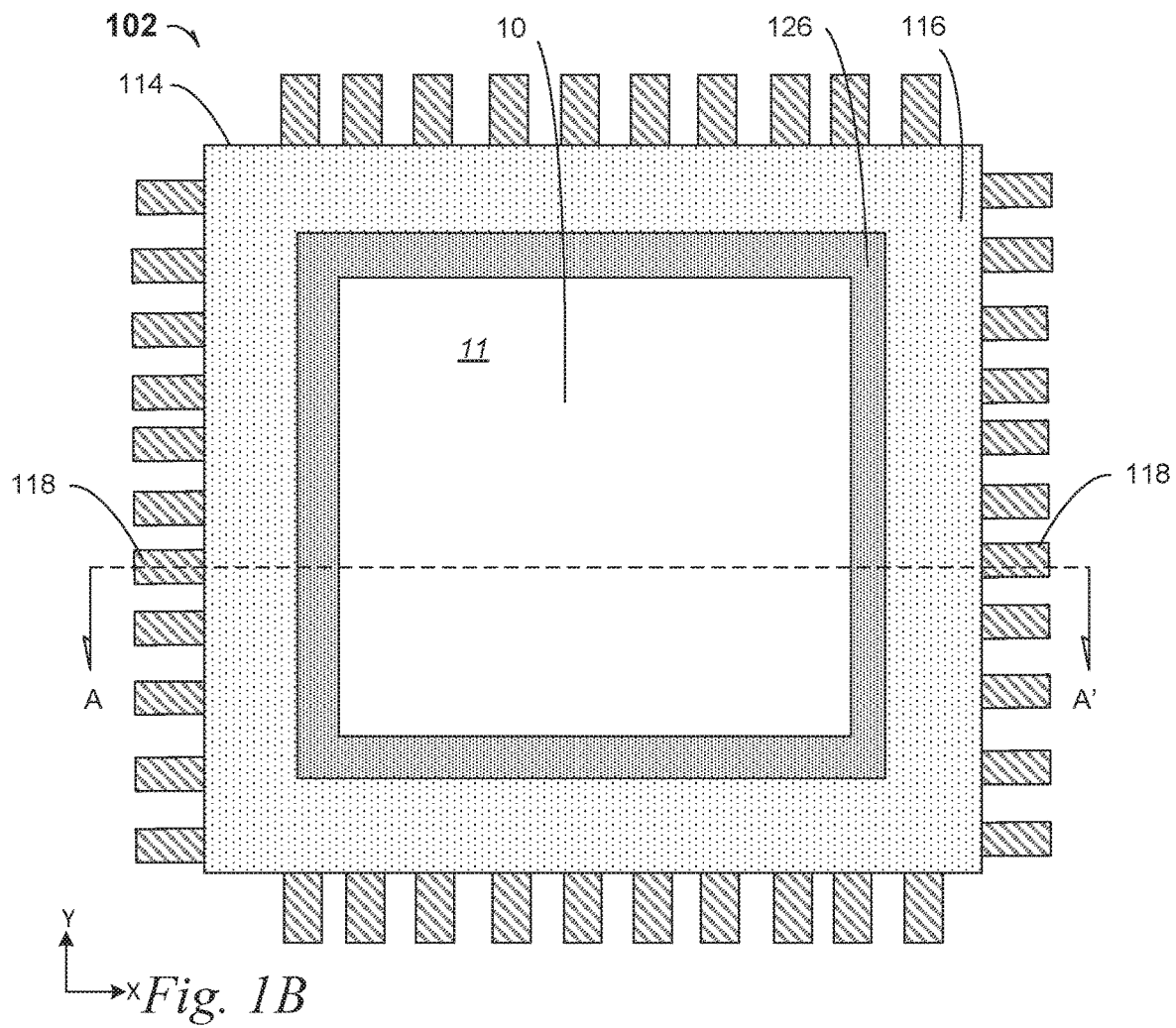
FIG. 1B is a top plan of the integrated-circuit package depicted in FIG. 1A according to an embodiment.

In an embodiment, an underfill material 126 protects a ball-grid array coupled to the IC die 10, and the underfill material 126 may be flowed onto the die side 111 against the molded frame 116 (although not pictured as such in FIG. 1A; see FIG. 1B).

In an embodiment, the board 112 has an external shell 128 that provides both physical and electrically insulative protection to the computing system that includes the T2B interconnect 114. For example, the external shell 128 is part of a handheld device such as a tablet or telephone. In an example embodiment, the external shell 128 is part of an autonomous vehicle such as a drone.

FIG. 1B is a top plan of the integrated-circuit package 101 depicted in FIG. 1A according to an embodiment. The integrated-circuit package 102 indicates the integrated-circuit package 101 by the section line A-A'. The integrated-circuit die 10 is seen in the center of the molded frame 116 with a die backside surface 11. The IC die 10 is also more or less centered by the folded interconnects 118 that emerge laterally from the molded frame 116 to contact the board 112 (see FIG. 1A). In an embodiment, the underfill material 126 emerges from beneath the integrated-circuit die 10, and abuts the molded frame 116.

As depicted, the T2B interconnect module 114 has a lead-frame form factor, and the several folded interconnects 118 increase the number of pin-out locations in addition to the ball-grid array 124 (see FIG. 1A) that couples the integrated-circuit package substrate 110 to the board 112.

FIG. 2A is a cross-section elevation of a top-to-bottom (T2B) interconnect lead frame module in an integrated-circuit package 201 according to an embodiment. An integrated-circuit die 20 is flip-chip mounted with a backside surface 21 at the top, onto an integrated-circuit package substrate 210 on a die side 111 according to an embodiment. At a land side 209, the integrated-circuit package substrate 210 is coupled to a board 212 by an array of electrical bumps, one of which is enumerated 224. On the board 212 at a package side 213, an external component 230 such as a voltage regulator 230, is coupled to an extension trace 234 of a T2B ganged, folded interconnect 232. Opposite the T2B ganged, folded interconnect 232 is a single T2B folded interconnect 218.

In an embodiment, the extension trace 234 of the T2B ganged, folded interconnect 232 is coupled to a lead-frame, top-to-bottom interconnect module 214 that includes a molded frame 216 and several folded interconnects that included single folded T2B interconnects 218 and selected ganged, folded interconnects 232. The T2B interconnects are coupled to the die side 211 on the integrated-circuit package substrate 210, and to the board 212 by a lead-frame interconnect foot 220. In an embodiment, the foot 220, if present, is electrically coupled to a bond pad on the board 212, by an electrical bump such as a solder bump 222.

Signal, power and ground coupling between the board 212 and the integrated-circuit die 20, can be both through the T2B interconnect 214, and through the electrical bumps 224 that contact the board 212 on a land side 109 of the integrated-circuit package substrate 210.

In an embodiment, the voltage regulator 230 is shunted around the bumps 224, the IC package substrate 210 and through the top-to-bottom interconnect module 214 for use by the IC die 20. The T2B interconnect 214, allows for voltage regulation from an external component 230, while leaving the real estate of the bumps 224 and most of the IC package substrate 210 for other functions.

In an embodiment, two IC dice are on the die side 211, such that a power-demanding die 20 enjoys shunted power regulation from the voltage regulator 230, but an adjacent die (see e.g., the subsequent die 42 in FIG. 4B) on the die side 211 received power and other inputs through the IC package substrate 210.

In an embodiment, the board 212 has an external shell 228 that provides both physical and electrically insulative protection to the computing system that includes the T2B interconnect 214. For example, the external shell 228 is part of a handheld device such as a tablet or telephone. In an example embodiment, the external shell 228 is part of an autonomous vehicle such as a drone.

FIG. 2B is a top plan of the T2B interconnect 214 depicted in FIG. 2A according to several embodiments. The T2B interconnect 214 includes the T2B ganged, folded interconnect 232 as well as several T2B folded interconnects 218. In an embodiment, a second ganged, folded interconnect 236 is provided such as for a second Vcc power supply that complements the first ganged, folded interconnect 232.

As depicted in an embodiment, a first IC die 20 such as a central processor die 20, is located on the die side 211 near the two ganged, folded interconnects 232 and 236, and at least the first ganged, folded interconnect is coupled to a voltage regulator 230 (see FIG. 2A). Further a subsequent IC die 22 shows a backside surface 23, and it is coupled both by a flip-chip bump array (not pictured) and by a subset of the folded interconnects 218 that are part of the T2B interconnect module 214. In an embodiment, a superset of folded interconnects 218 provide a surfeit of interconnects for the dice 20 and 22. In an embodiment, all of the folded interconnects 218 as well as the ganged folded interconnects 232 and 236 are coupled to the combination of the two IC dice 20 and 22.

Figure 3:
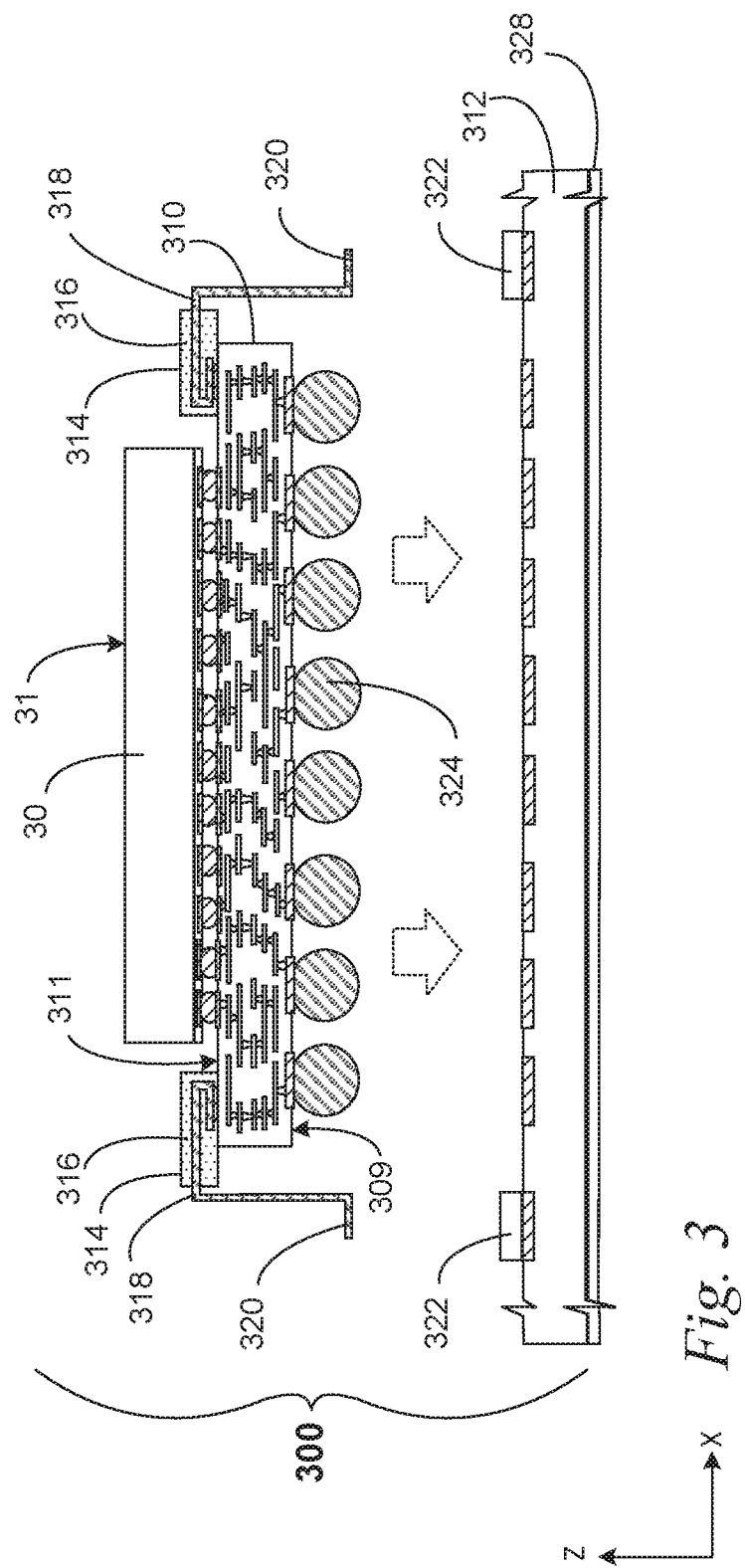
FIG. 3 is a cross-section elevation of a top-to-bottom folded interconnect on an integrated-circuit package substrate during assembly onto a board according to an embodiment.

FIG. 3 is a cross-section elevation of a top-to-bottom folded interconnect module on an integrated-circuit package substrate during assembly 300 onto a board according to an embodiment.

An integrated-circuit die 30 is flip-chip mounted on an integrated-circuit package substrate 310 on a die side 311 according to an embodiment. At a land side 309, the integrated-circuit package substrate 310 is being brought into contact with a board 312 by an array of electrical bumps, one of which is enumerated 324.

In an embodiment, a lead-frame, top-to-bottom interconnect module 314 includes a molded frame 316 and a folded interconnect 318 that is coupled to the die side 311 on the integrated-circuit package substrate 310, and is being coupled to the board 312 by a lead-frame interconnect foot 320. In an embodiment, the foot 320, if present, is being electrically coupled to a bond pad on the board 312, by an electrical bump precursor such as solder bump 322. Signal, power and ground coupling between the board 312 and the integrated-circuit die 30, can be both through the T2B interconnect module 314, and through the electrical bumps 324 that will contact the board 312 on a land side 309 of the integrated-circuit package substrate 310.

After contact of the bumps 324 with the board 312, and the bump precursors 322 by the feet 320, a reflow process achieves a connected apparatus between the IC die 30 and the board 312 according to an embodiment.

In an embodiment, the board 312 has an external shell 328 that provides both physical and electrically insulative protection to the computing system that includes the T2B interconnect 314. For example, the external shell 328 is part of a handheld device such as a tablet or telephone. In an example embodiment, the external shell 328 is part of an autonomous vehicle such as a drone.

Figure 4A:
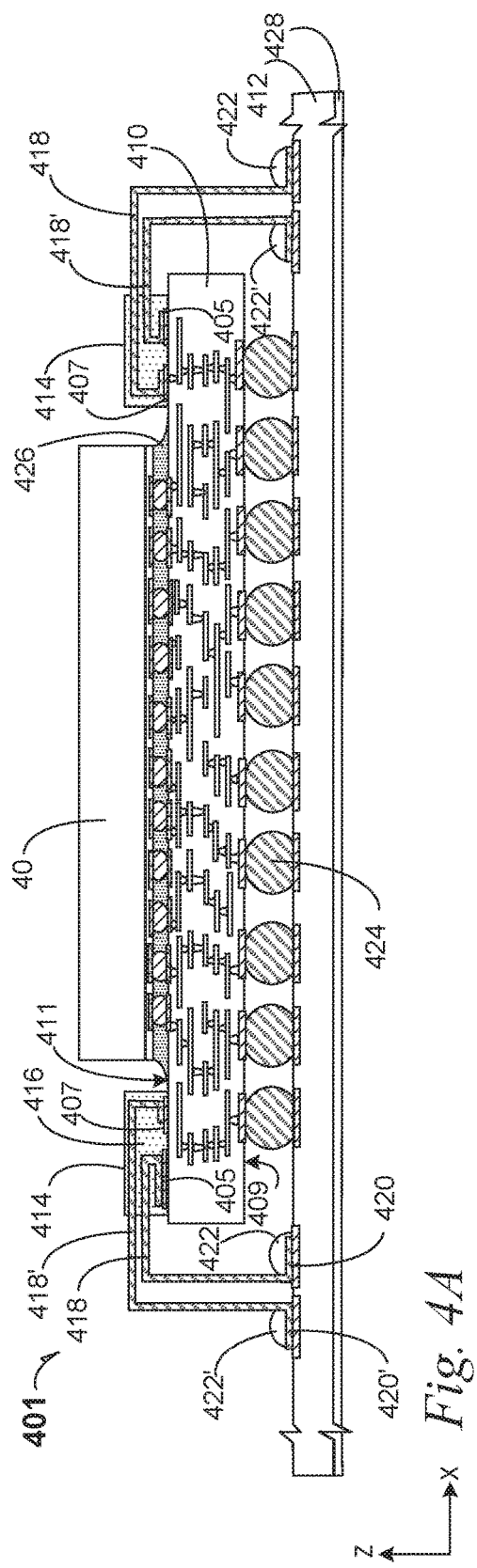
FIG. 4A is a cross-section elevation of a nested, folded top-to-bottom interconnect lead frame in an integrated-circuit package according to an embodiment.

FIG. 4A is a cross-section elevation of a top-to-bottom (T2B) interconnect lead frame module in an integrated-circuit package 401 according to an embodiment. An integrated-circuit die 40 is flip-chip mounted on an integrated-circuit package substrate 410 on a die side 411 according to an embodiment. At a land side 409, the integrated-circuit package substrate 410 is coupled to a board 412 by an array of electrical bumps, one of which is enumerated 424.

In an embodiment, a lead-frame, top-to-bottom interconnect module 414 includes a molded frame 416 and nested, folded top-to-bottom interconnects 418 and 418' that are coupled to the die side 411 on the integrated-circuit package substrate 410, and to the board 412, each by a lead-frame interconnect foot 420 and 420'.

In an embodiment, each foot 420 and 420', if present, is electrically coupled to a bond pad 422 and 422' on the board 412, by an electrical bump such as solder bump 422 and 422'. Signal, power and ground coupling between the board 412 and the integrated-circuit die 40, can be both through the nested, folded T2B interconnect 414, and through the electrical bumps 424 that contact the board 412 from the land side 409 of the integrated-circuit package substrate 410.

In an embodiment, the nested, folded T2B interconnect 418 is an outer and lower nested, folded T2B interconnect 418. The "outer" designation refers to origination of the interconnect 418 in an outer periphery on the die side 411. Further the nested, folded T2B interconnect 418' is an inner and upper nested, folded T2B interconnect 418'. The "inner" designation refers to origination of the interconnect 418' in an inner periphery on the die side 411. The outer and lower nested, folded T2B interconnect 418 couples to the die side 411 at an outer periphery of bond pads 405, and the inner and lower nested, folded T2B interconnect 418; couples to the die side 411 at an inner periphery of bond pads 407.

In an embodiment, an underfill material 426 protects a ball-grid array coupled to the IC die 40, and the underfill material 426 may be flowed onto the die side 411 against the molded frame 416.

In an embodiment, a signal integrity technique is used by supplying an I/O signal in the nested, folded T2B interconnect 418, and a power source Vss (ground) connection in the nested, folded T2B interconnect 418', where the Vss connection 418' provides signal protection for the I/O signal connection 418. In an embodiment, a signal integrity technique is used by supplying a Vss connection to the nested, folded T2B interconnect 418', and an I/O signal connection is in the nested, folded T2B interconnect 418, where the Vss connection 418 provides signal protection for the IO signal connection 418'.

As illustrated, the frame material 416 exposes a die-side level portion of the folded portions 418 and 418', where the folded portion of the interconnects 418 and 418' respectively contact the interconnect-pad arrays 405 and 407, which are also referred to as respective outer 405 and outer periphery interconnect-pad arrays. In an embodiment, the folded interconnect 118 terminal end 120 is below the die side 111 in an embodiment. In an embodiment, the folded interconnect 118 terminal end 120 is below the land side 109.

In an embodiment, the board 412 has an external shell 428 that provides both physical and electrically insulative protection to the computing system that includes the T2B interconnect 414. For example, the external shell 428 is part of a handheld device such as a tablet or telephone. In an example embodiment, the external shell 428 is part of an autonomous vehicle such as a drone.

Figure 4B:
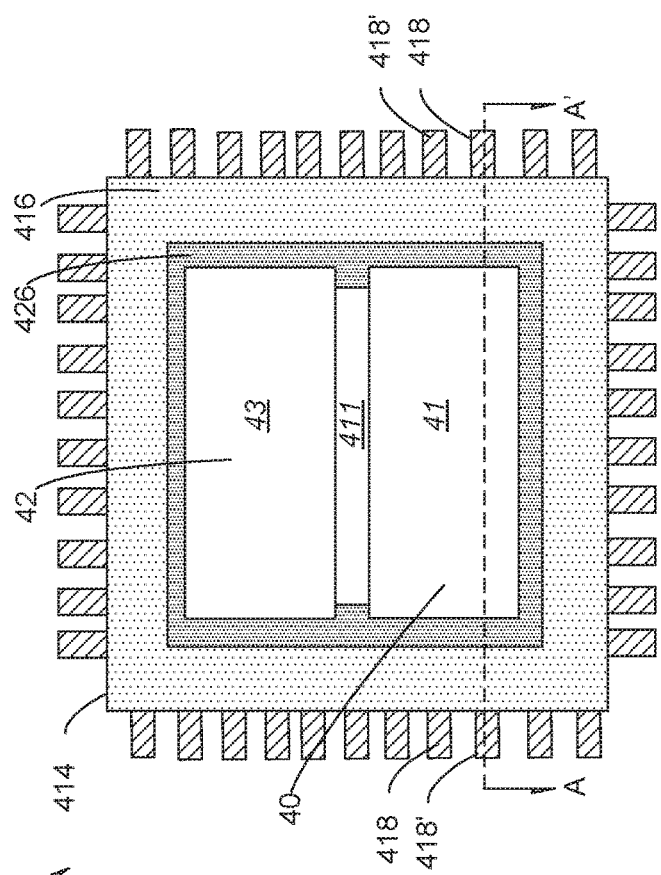
FIG. 4B is a top plan of the nested, folded top-to-bottom interconnect depicted in FIG. 4A according to several embodiments.

FIG. 4B is a FIG. 1B is a top plan of the integrated-circuit package 401 depicted in FIG. 4A according to an embodiment. The integrated-circuit package 402 indicates the integrated-circuit package 401 by the section line A-A'. The integrated-circuit die 40 is seen with a die backside surface 41, in an infield region of the die side 411, which is part of the center of the molded frame 416. According to an embodiment, a subsequent IC die 42 is also seen adjacent the first IC die 40, and it shows a backside surface 43. The first and subsequent IC dice 40 and 42 are also more or less centered by the nested, folded interconnects 418 that emerge laterally from the molded frame 416 to contact the board 412 (see FIG. 4A). In an embodiment, the underfill material 426 emerges from beneath the integrated-circuit die 40, and abuts the molded frame 416.

As depicted, the T2B interconnect module 114 has a lead-frame form factor, and the several folded interconnects 418 and 418' increase the number of pin-out locations in addition to the ball-grid array 424 (see FIG. 4A) that couples the integrated-circuit package substrate 410 to the board 412.

It is understood the nested, folded T2B interconnect module 414 includes the nested, folded T2B interconnects 418 and 418' in a configuration that extend from the molded material 416 in a quadrilateral symmetry. Signal integrity is facilitated by placing selected signal I/O interconnects 418 arrayed next to Vcc interconnects 418'. In an embodiment, a comparative example uses a conventional package that supports a given IC die. A conventional package has an effective area of 490 mm2 and a pin count. By comparison, a nested, folded T2B interconnect 414 on a package substrate 410, has an effective area of 453 mm2 and a pin count of 1436, which includes 1044 flip-chip bumps 424, and 196 each nested folded T2B interconnects 418 and 418'. Accordingly, a smaller package footprint supports the same amount of IC hardware, including on-package devices such as a voltage regulator, and pin count is increased.

Figure 5:
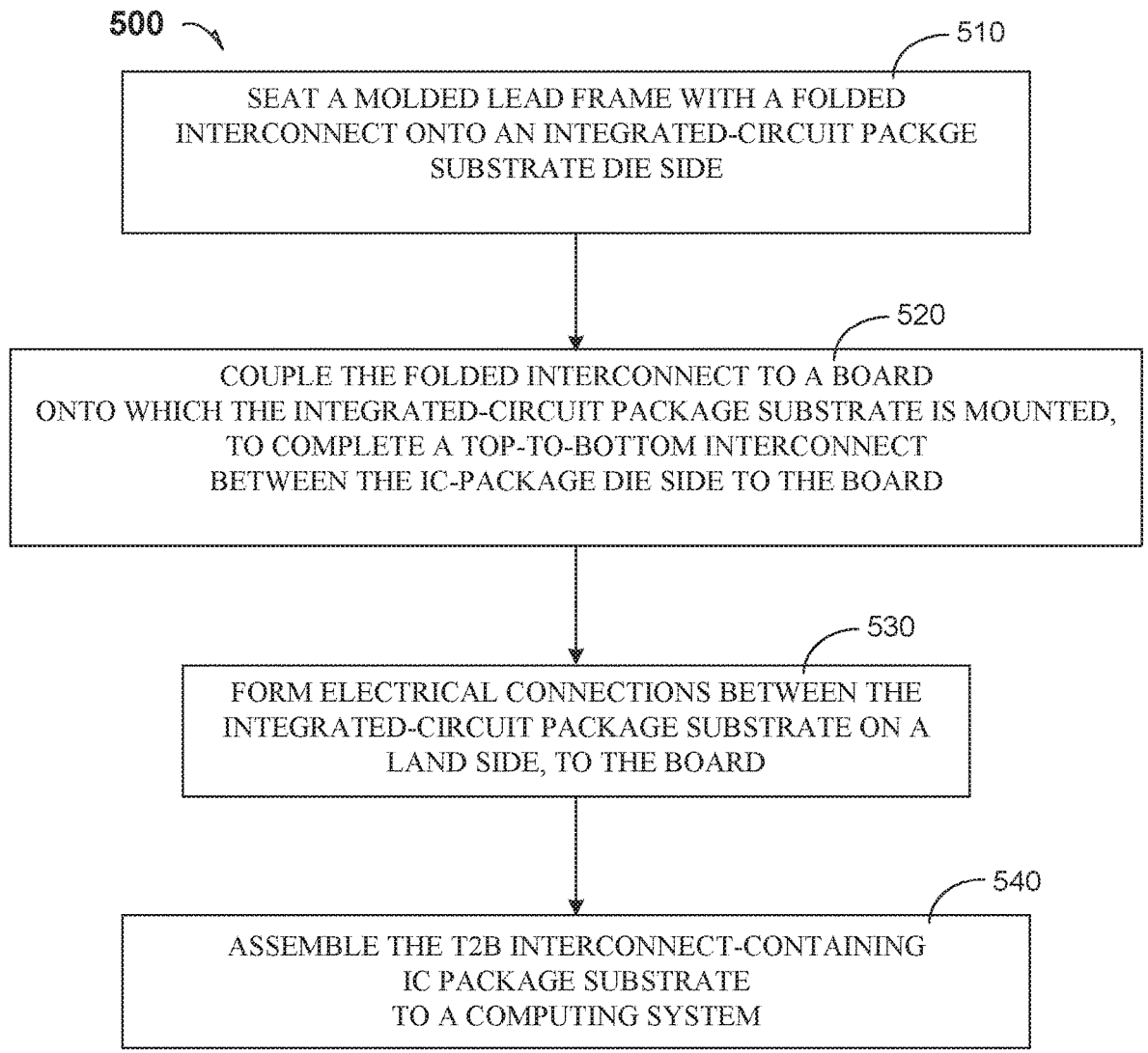
FIG. 5 is a process flow diagram according to several embodiments.

FIG. 5 is a process flow diagram according to several embodiments.

At 510, the process includes seating a molded lead frame with a folded interconnect onto an integrated-circuit package substrate on a die side of the IC package substrate.

At 520, the process includes coupling the folded interconnect to a board onto which the IC package substrate is mounted, to complete a top-to-bottom interconnect between the ID package substrate die side to the board.

At 530, the process includes forming electrical connections between the IC package substrate on a land side and the board.

At 540, the process includes assembling the folded T2B interconnect-containing IC package substrate to a computing system.

Figure 6:
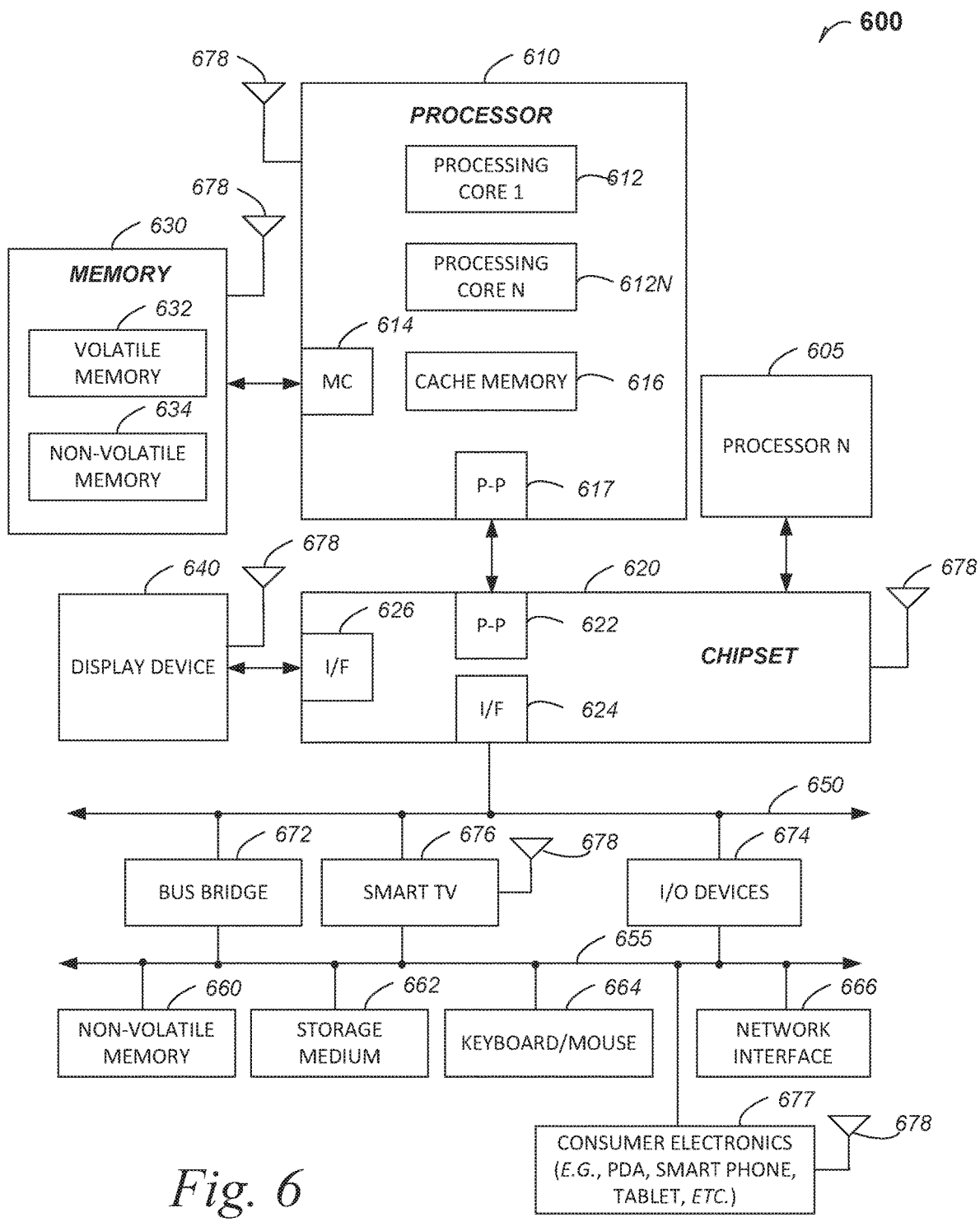
FIG. 6 is included to show an example of a higher-level device application for the disclosed embodiments.

FIG. 6 is included to show an example of a higher-level device application for the disclosed embodiments. The folded top-to-bottom interconnect embodiments may be found in several parts of a computing system. In an embodiment, the folded top-to-bottom interconnect embodiments can be part of a communications apparatus such as is affixed to a cellular communications tower. In an embodiment, a computing system 600 includes, but is not limited to, a desktop computer. In an embodiment, a computing system 600 includes, but is not limited to a laptop computer. In an embodiment, a computing system 600 includes, but is not limited to a tablet. In an embodiment, a computing system 600 includes, but is not limited to a notebook computer. In an embodiment, a computing system 600 includes, but is not limited to a personal digital assistant (PDA). In an embodiment, a computing system 600 includes, but is not limited to a server. In an embodiment, a computing system 600 includes, but is not limited to a workstation. In an embodiment, a computing system 600 includes, but is not limited to a cellular telephone. In an embodiment, a computing system 600 includes, but is not limited to a mobile computing device. In an embodiment, a computing system 600 includes, but is not limited to a smart phone. In an embodiment, a system 600 includes, but is not limited to an internet appliance. Other types of computing devices may be configured with the microelectronic device that includes folded top-to-bottom interconnect embodiments.

In an embodiment, the processor 610 has one or more processing cores 612 and 612N, where 612N represents the Nth processor core inside processor 610 where N is a positive integer.

In an embodiment, the electronic device system 600 using a folded top-to-bottom interconnect embodiment that includes multiple processors including 610 and 605, where the processor 605 has logic similar or identical to the logic of the processor 610. In an embodiment, the processing core 612 includes, but is not limited to, pre-fetch logic to fetch instructions, decode logic to decode the instructions, execution logic to execute instructions and the like. In an embodiment, the processor 610 has a cache memory 616 to cache at least one of instructions and data for the folded top-to-bottom interconnect on an integrated-circuit package substrate in the system 600. The cache memory 616 may be organized into a hierarchal structure including one or more levels of cache memory.

In an embodiment, the processor 610 includes a memory controller 614, which is operable to perform functions that enable the processor 610 to access and communicate with memory 630 that includes at least one of a volatile memory 632 and a non-volatile memory 634. In an embodiment, the processor 610 is coupled with memory 630 and chipset 620. In an embodiment, the chipset 620 is part of a folded top-to-bottom interconnect embodiment depicted in FIG. 1A. The processor 610 may also be coupled to a wireless antenna 678 to communicate with any device configured to at least do one of transmit and receive wireless signals. In an embodiment, the wireless antenna interface 678 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 632 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. The non-volatile memory 634 includes, but is not limited to, flash memory, phase change memory (PCM), read-only memory (ROM), electrically erasable programmable read-only memory (EEPROM), or any other type of non-volatile memory device.

The memory 630 stores information and instructions to be executed by the processor 610. In an embodiment, the memory 630 may also store temporary variables or other intermediate information while the processor 610 is executing instructions. In the illustrated embodiment, the chipset 620 connects with processor 610 via Point-to-Point (PtP or P-P) interfaces 617 and 622. Either of these PtP embodiments may be achieved using a folded top-to-bottom interconnect embodiment as set forth in this disclosure. The chipset 620 enables the processor 610 to connect to other elements in a folded top-to-bottom interconnect embodiment in a system 600. In an embodiment, interfaces 617 and 622 operate in accordance with a PtP communication protocol such as the Intel® QuickPath Interconnect (QPI) or the like. In other embodiments, a different interconnect may be used.

In an embodiment, the chipset 620 is operable to communicate with the processor 610, 605N, the display device 640, and other devices 672, 676, 674, 660, 662, 664, 666, 677, etc. The chipset 620 may also be coupled to a wireless antenna 678 to communicate with any device configured to at least do one of transmit and receive wireless signals.

The chipset 620 connects to the display device 640 via the interface 626. The display 640 may be, for example, a liquid crystal display (LCD), a plasma display, cathode ray tube (CRT) display, or any other form of visual display device. In an embodiment, the processor 610 and the chipset 620 are merged into a folded top-to-bottom interconnect embodiment in a system. Additionally, the chipset 620 connects to one or more buses 650 and 655 that interconnect various elements 674, 660, 662, 664, and 666. Buses 650 and 655 may be interconnected together via a bus bridge 672 such as at least one folded top-to-bottom interconnect embodiment. In an embodiment, the chipset 620, via interface 624, couples with a non-volatile memory 660, a mass storage device(s) 662, a keyboard/mouse 664, a network interface 666, smart TV 676, and the consumer electronics 677, etc.

In an embodiment, the mass storage device 662 includes, but is not limited to, a solid-state drive, a hard disk drive, a universal serial bus flash memory drive, or any other form of computer data storage medium. In one embodiment, the network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the folded top-to-bottom interconnect embodiments in a computing system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into the processor core 612.

To illustrate the folded top-to-bottom interconnect embodiments and methods disclosed herein, a non-limiting list of examples is provided herein:

Example 1 is an integrated-circuit package assembly, comprising: an integrated-circuit package substrate including a die side and a land side; a central bump-pad array on the die side; a peripheral interconnect array on the die side; a folded interconnect coupled to the die side, wherein the folded interconnect is coupled to a peripheral interconnect of the peripheral interconnect array, wherein the folded interconnect is in a frame, and wherein the folded interconnect includes a terminal end that extends below the land side; and wherein the bump-pad array is in an infield surrounded by the frame.

In Example 2, the subject matter of Example 1 optionally includes an integrated-circuit die on the die side, wherein the integrated-circuit die is coupled to the folded interconnect and wherein the integrated-circuit die is coupled to the land side through the integrated-circuit package substrate.

In Example 3, the subject matter of any one or more of Examples 1-2 optionally include an integrated-circuit die on the die side, wherein the integrated-circuit die is coupled to a plurality of folded interconnects, and wherein the integrated-circuit die is coupled to the land side through the integrated-circuit package substrate; and wherein plurality of folded interconnects are coupled to a chipset on a board, including a voltage regulator on the board.

In Example 4, the subject matter of any one or more of Examples 1-3 optionally include an integrated-circuit die on the die side, wherein the integrated-circuit die is coupled to a plurality of folded interconnects, and wherein the integrated-circuit die is coupled to the land side through the integrated-circuit package substrate; and wherein plurality of folded interconnects are coupled to a chipset on a board, including a voltage regulator on the board; wherein the integrated-circuit die is part of a chipset on the board; and wherein the board includes an integral external shell.

In Example 5, the subject matter of any one or more of Examples 1-4 optionally include wherein the frame is a molded material the covers a folded portion of the folded interconnect, and that exposes a die-side level portion of the folded portion.

In Example 6, the subject matter of any one or more of Examples 1-5 optionally include wherein the frame is a molded material the covers a folded portion of the folded interconnect, and that exposes a die-side level portion of the folded portion; and wherein the terminal end includes a foot.

In Example 7, the subject matter of any one or more of Examples 1-6 optionally include wherein the frame is a molded material the covers a folded portion of the folded interconnect, and that exposes a die-side level portion of the folded portion, and wherein the terminal end includes a foot, further including: a board, wherein the foot is coupled to the board; and an electrical bump array in contact with the land side and the board.

In Example 8, the subject matter of any one or more of Examples 1-7 optionally include wherein the frame is a molded material the covers a folded portion of the folded interconnect, and that exposes a die-side level portion of the folded portion, and wherein the terminal end includes a foot, further including: a board, wherein the foot is coupled to the board; an electrical bump array in contact with the land side and the board; and an electrical bump contacting the foot and the board.

In Example 9, the subject matter of any one or more of Examples 1-8 optionally include a board, wherein the foot is coupled to the board; an electrical bump array in contact with the land side and the board; an electrical bump contacting the foot and the board; and an integrated-circuit die on the die side, wherein the folded interconnect is one of an array of folded interconnects in a frame that forms a periphery around the integrated-circuit die, wherein the integrated-circuit die is coupled to the board by the folded interconnect and by an electrical bump array between the land side and the board.

In Example 10, the subject matter of any one or more of Examples 1-9 optionally include an integrated-circuit die on the die side, wherein the folded interconnect is one of a plurality of folded interconnects; wherein the integrated-circuit die is coupled to the folded interconnect and wherein the integrated-circuit die is coupled to the land side through the integrated-circuit package substrate by a plurality of electrical bumps; and wherein the folded interconnect is one of a plurality of folded interconnects, and wherein the plurality of folded interconnects and the plurality of electrical bumps, are more interconnections than interconnections on the integrated-circuit die.

In Example 11, the subject matter of any one or more of Examples 1-10 optionally include a first integrated-circuit die on the die side; a subsequent integrated-circuit die on the die side; and wherein the first and subsequent integrated-circuit dice are in an infield area formed by the frame.

In Example 12, the subject matter of any one or more of Examples 1-11 optionally include a first integrated-circuit die on the die side; a subsequent integrated-circuit die on the die side; and wherein the first and subsequent integrated-circuit dice are in an infield area formed by the frame: wherein the folded interconnect is one of a plurality of folded interconnects, and wherein the plurality of folded interconnects and the plurality of electrical bumps, are more interconnections than interconnections on the combined first and subsequent integrated-circuit dice.

Example 13 is an integrated-circuit package assembly, comprising: an integrated-circuit package substrate including a die side and a land side; a central bump-pad array on the die side; an inner peripheral interconnect array on the die side; an outer peripheral interconnect array on the die side, wherein the outer peripheral interconnect array forms an outer periphery around the inner peripheral interconnect array; an outer lower, folded interconnect coupled to the die side, wherein the outer lower folded interconnect is coupled to an outer peripheral interconnect of the outer peripheral interconnect array; an inner upper, folded interconnect coupled to the die side, wherein the inner upper folded interconnect is coupled to an inner peripheral interconnect of the inner interconnect array; wherein each of the respective inner upper and outer lower interconnects is in a frame, and wherein each of the respective inner lower and outer upper interconnect includes a terminal end that extends below the land side; and wherein the central bump-pad array is in an infield surrounded by the frame.

In Example 14, the subject matter of Example 13 optionally includes an integrated-circuit die on the die side, wherein the integrated-circuit die is coupled to each of the inner upper and the lower outer folded interconnects, and wherein the integrated-circuit die is coupled to the land side through the integrated-circuit package substrate.

In Example 15, the subject matter of any one or more of Examples 13-14 optionally include an integrated-circuit die on the die side, wherein the integrated-circuit die is coupled to each of the inner upper and the lower outer folded interconnects, and wherein the integrated-circuit die is coupled to the land side through the integrated-circuit package substrate; and wherein inner upper folded interconnect array and the outer lower folded interconnect array are coupled to a chipset on a board, including a voltage regulator on the board.

In Example 16, the subject matter of any one or more of Examples 13-15 optionally include an integrated-circuit die on the die side, wherein the integrated-circuit die is coupled to each of the inner upper and the lower outer folded interconnects, and wherein the integrated-circuit die is coupled to the land side through the integrated-circuit package substrate; wherein inner upper folded interconnect array and the outer lower folded interconnect array are coupled to a chipset on a board, including a voltage regulator on the board; and wherein the board includes an integral external shell.

In Example 17, the subject matter of any one or more of Examples 13-16 optionally include wherein the frame is a molded material the covers a folded portion of each of the inner lower and outer upper folded interconnects, and that exposes a die-side level portion of each folded portion.

In Example 18, the subject matter of any one or more of Examples 13-17 optionally include wherein the frame is a molded material the covers a folded portion of each of the inner lower and outer upper folded interconnect, and that exposes a die-side level portion of the folded portion; and wherein each terminal end includes a foot.

In Example 19, the subject matter of any one or more of Examples 13-18 optionally include wherein the frame is a molded material the covers a folded portion of each of the outer lower and inner upper folded interconnect, and that exposes a die-side level portion of each folded portion, and wherein each terminal end includes a foot, further including: a board, wherein each foot is coupled to the board; and an electrical bump array in contact with the land side and the board.

In Example 20, the subject matter of any one or more of Examples 13-19 optionally include an integrated-circuit die on the die side, wherein the inner upper folded interconnect and the outer lower folded interconnect are two of a plurality of inner upper and outer lower folded interconnects; wherein the integrated-circuit die is coupled to the inner upper and outer lower folded interconnects and wherein the integrated-circuit die is coupled to the land side through the integrated-circuit package substrate by a plurality of electrical bumps; and wherein the plurality of inner upper and lower outer folded interconnects, and the plurality of electrical bumps, are more interconnections than interconnections on the integrated-circuit die.

In Example 21, the subject matter of any one or more of Examples 13-20 optionally include a first integrated-circuit die on the die side; a subsequent integrated-circuit die on the die side; and wherein the first and subsequent integrated-circuit dice are in an infield area formed by the frame.

In Example 22, the subject matter of any one or more of Examples 13-21 optionally include a first integrated-circuit die on the die side; a subsequent integrated-circuit die on the die side; and wherein the first and subsequent integrated-circuit dice are in an infield area formed by the frame: and wherein the folded interconnect is one of a plurality of folded interconnects, and wherein the plurality of folded interconnects and the plurality of electrical bumps, are more interconnections than interconnections on the combined first and subsequent integrated-circuit dice.

Example 23 is a method of assembling an integrated-circuit package, comprising: seating a molded lead frame with a folded interconnect, onto a die side of an integrated circuit package substrate; coupling the folded interconnect to a board onto which the integrated-circuit package substrate is mounted; and forming an electrical connection between the integrated-circuit package substrate on a land side, to the board.

In Example 24, the subject matter of Example 23 optionally includes wherein the folded interconnect is folded within the molded lead frame, and wherein the folded interconnect has a foot where the folded interconnect contacts the board, further including: contacting the foot and the board with an electrical bump; and reflowing electrical bumps between the land side and the board.

In Example 25, the subject matter of any one or more of Examples 23-24 optionally include wherein the folded interconnect is folded within the molded lead frame, and wherein the folded interconnect has a foot where the folded interconnect contacts the board, further including: contacting the foot and the board with an electrical bump; reflowing electrical bumps between the land side and the board; and seating an integrated-circuit die on the die side in an infield formed by the frame.

In Example 26, the subject matter of any one or more of Examples 23-25 optionally include wherein the folded interconnect is a lower outer folded interconnect, further including: coupling an upper inner folded interconnect to the board, wherein the upper inner folded interconnect includes a portion that is above the lower outer folded interconnect.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. An integrated-circuit package assembly, comprising: an integrated-circuit package substrate including a die side and a land side; a central bump-pad array on the die side; a peripheral interconnect array on the die side; a folded interconnect coupled to the die side, wherein the folded interconnect is coupled to a peripheral interconnect of the peripheral interconnect array, wherein the folded interconnect is in a frame, and wherein the folded interconnect includes a terminal end that extends below the land side; and wherein the bump-pad array is in an infield surrounded by the frame, further including: an integrated-circuit die on the die side, wherein the integrated-circuit die is coupled to a plurality of folded interconnects, and wherein the integrated-circuit die is coupled to the land side through the integrated-circuit package substrate; and wherein plurality of folded interconnects are coupled to a chipset on a board, including a voltage regulator on the board.

2. The integrated-circuit package assembly of claim 1, further including an integrated-circuit die on the die side, wherein the integrated-circuit die is coupled to the folded interconnect and wherein the integrated-circuit die is coupled to the land side through the integrated-circuit package substrate.

3. The integrated-circuit package assembly of claim 1, further including:
   an integrated-circuit die on the die side, wherein the integrated-circuit die is coupled to a plurality of folded interconnects, and wherein the integrated-circuit die is coupled to the land side through the integrated-circuit package substrate; and
   wherein plurality of folded interconnects are coupled to a chipset on a board, including a voltage regulator on the board;
   wherein the integrated-circuit die is part of a chipset on the board; and
   wherein the board includes an integral external shell.

4. The integrated-circuit package assembly of claim 1, wherein the frame is a molded material the covers a folded portion of the folded interconnect, and that, exposes a die-side level portion of the folded portion.

5. The integrated-circuit package assembly of claim 1, wherein the frame is a molded material the covers a folded portion of the folded interconnect, and that exposes a die-side level portion of the folded portion; and
   wherein the terminal end includes a foot.

6. The integrated-circuit package assembly of claim 1, wherein the frame is a molded material the covers a folded portion of the folded interconnect, and that exposes a die-side level portion of the folded portion, and wherein the terminal end includes a foot, further including:
   a board, wherein the foot is coupled to the board; and
   an electrical bump array in contact with the land side and the board.

7. The integrated-circuit package assembly of claim 1, wherein the frame is a molded material the covers a folded portion of the folded interconnect, and that exposes a die-side level portion of the folded portion, and wherein the terminal end includes a foot, further including:
   a board, wherein the foot is coupled to the board;
   an electrical bump array in contact with the land side and the board; and
   an electrical bump contacting the foot and the board.

8. The integrated-circuit package assembly of claim 1, further including:
   a board, wherein the foot is coupled to the board;
   an electrical bump array in contact with the land side and the board;
   an electrical bump contacting the foot and the board; and
   an integrated-circuit die on the die side, wherein the folded interconnect is one of an array of folded interconnects in a frame that forms a periphery around the integrated-circuit die, wherein the integrated-circuit die is coupled to the board by the folded interconnect and by an electrical bump array between the land side and the board.

9. The integrated-circuit package assembly of claim 1, further including:
   an integrated-circuit die on the die side, wherein the folded interconnect is one of a plurality of folded interconnects;
   wherein the integrated-circuit die is coupled to the folded interconnect and wherein the integrated-circuit die is coupled to the land side through the integrated-circuit package substrate by a plurality of electrical bumps; and
   wherein the folded interconnect is one of a plurality of folded interconnects, and wherein the plurality of folded interconnects and the plurality of electrical bumps, are more interconnections than interconnections on the integrated-circuit die.

10. The integrated-circuit package substrate of claim 1, further including:
a first integrated-circuit die on the die side;
a subsequent integrated-circuit die on the die side; and
wherein the first and subsequent integrated-circuit dice are in an infield area formed by the frame.

11. The integrated-circuit package substrate of claim 1, further including:
a first integrated-circuit die on the die side;
a subsequent integrated-circuit die on the die side; and
wherein the first and subsequent integrated-circuit dice are in an infield area formed by the frame:
wherein the folded interconnect is one of a plurality of folded interconnects, and wherein the plurality of folded interconnects and the plurality of electrical bumps, are more interconnections than interconnections on the combined first, and subsequent integrated-circuit dice.

12. An integrated-circuit package assembly, comprising: an integrated-circuit package substrate including a die side and a land side; a central bump-pad array on the die side; an inner peripheral interconnect array on the die side; an outer peripheral interconnect array on the die side, wherein the outer peripheral interconnect array forms an outer periphery around the inner peripheral interconnect array; an outer lower, folded interconnect coupled to the die side, wherein the outer lower folded interconnect is coupled to an outer peripheral interconnect of the outer peripheral interconnect array; an inner upper, folded interconnect coupled to the die side, wherein the inner upper folded interconnect is coupled to an inner peripheral interconnect of the inner interconnect array; wherein each of the respective inner upper and outer lower interconnects is in a frame, and wherein each of the respective inner lower and outer upper interconnect includes a terminal end that extends below the land side; and wherein the central bump-pad array is in an infield surrounded by the frame, further including: an integrated-circuit die on the die side, wherein the integrated-circuit die is coupled to each of the inner upper and the lower outer folded interconnects, and wherein the integrated-circuit die is coupled to the land side through the integrated-circuit package substrate; and wherein inner upper folded interconnect array and the outer lower folded interconnect array are coupled to a chipset on a board, including a voltage regulator on the board.

13. The integrated-circuit package assembly of claim 12, further including an integrated-circuit die on the die side, wherein the integrated-circuit die is coupled to each of the inner upper and the lower outer folded interconnects, and wherein the integrated-circuit die is coupled to the land side through the integrated-circuit package substrate.

14. The integrated-circuit package assembly of claim 12, further including:
an integrated-circuit die on the die side, wherein the integrated-circuit die is coupled to each of the inner upper and the lower outer folded interconnects, and wherein the integrated-circuit die is coupled to the land side through the integrated-circuit package substrate;
wherein inner upper folded interconnect array and the outer lower folded interconnect array are coupled to a chipset on a board, including a voltage regulator on the board; and
wherein the board includes an integral external shell.

15. The integrated-circuit package assembly of claim 12, wherein the frame is a molded material the covers a folded portion of each of the inner lower and outer upper folded interconnects, and that exposes a die-side level portion of each folded portion.

16. The integrated-circuit package assembly of claim 12, wherein the frame is a molded material the covers a folded portion of each of the inner lower and outer upper folded interconnect, and that exposes a die-side level portion of the folded portion; and
wherein each terminal end includes a foot.

17. The integrated-circuit package assembly of claim 12, wherein the frame is a molded material the covers a folded portion of each of the outer lower and inner upper folded interconnect, and that exposes a die-side level portion of each folded portion, and wherein each terminal end includes a foot, further including:
a board, wherein each foot is coupled to the board; and
an electrical bump array in contact with the land side and the board.

18. The integrated-circuit package assembly of claim 12, further including:
an integrated-circuit die on the die side, wherein the inner upper folded interconnect and the outer lower folded interconnect are two of a plurality of inner upper and outer lower folded interconnects;
wherein the integrated-circuit die is coupled to the inner upper and outer lower folded interconnects and wherein the integrated-circuit die is coupled to the land side through the integrated-circuit package substrate by a plurality of electrical bumps; and
wherein the plurality of inner upper and lower outer folded interconnects, and the plurality of electrical bumps, are more interconnections than interconnections on the integrated-circuit die.

19. The integrated-circuit package substrate of claim 12, further including:
a first integrated-circuit die on the die side;
a subsequent integrated-circuit die on the die side; and
wherein the first and subsequent integrated-circuit dice are in an infield area formed by the frame.

20. The integrated-circuit package substrate of claim 12, further including:
a first integrated-circuit die on the die side;
a subsequent integrated-circuit die on the die side; and
wherein the first and subsequent integrated-circuit dice are in an infield area formed by the frame; and
wherein the folded interconnect is one of a plurality of folded interconnects, and wherein the plurality of folded interconnects and the plurality of electrical bumps, are more interconnections than interconnections on the combined first and subsequent integrated-circuit dice.

21. A method of assembling an integrated-circuit package, comprising: seating a molded lead frame with a folded interconnect, onto a die side of an integrated circuit package substrate; coupling the folded interconnect to a board onto which the integrated-circuit package substrate is mounted; and forming an electrical connection between the integrated-circuit package substrate on a land side, to the board, wherein the folded interconnect is folded within the molded lead frame, and wherein the folded interconnect has a foot where the folded interconnect contacts the board, further including: contacting the foot and the board with an electrical bump; reflowing electrical bumps between the land side and the board; and seating an integrated-circuit die on the die side in an infield formed by the frame.

22. The method of claim 21, wherein the folded interconnect is folded within the molded lead frame, and wherein the folded interconnect has a foot where the folded interconnect contacts the board, further including:
   contacting the foot and the board with an electrical bump; and
   reflowing electrical bumps between the land side and the board.

23. The method of claim 21, wherein the folded interconnect s a lower outer folded interconnect, further including:
   coupling an upper inner folded interconnect to the board, wherein the upper inner folded interconnect includes a portion that is above the lower outer folded interconnect.

\* \* \* \* \*